(12) United States Patent
Morimoto

(10) Patent No.: US 9,087,990 B2
(45) Date of Patent: Jul. 21, 2015

(54) METHOD OF AND APPARATUS FOR FABRICATING ORGANIC ELECTROLUMINESCENCE DISPLAY DEVICE

(71) Applicant: SAMSUNG DISPLAY CO., LTD., Yongin, Gyeonggi-Do (KR)

(72) Inventor: Kazunori Morimoto, Yokohama (JP)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 0 days.

(21) Appl. No.: 14/276,196

(22) Filed: May 13, 2014

(65) Prior Publication Data

US 2014/0342482 A1    Nov. 20, 2014

(30) Foreign Application Priority Data

May 14, 2013 (JP) ................................ 2013-102363

(51) Int. Cl.
| | |
|---|---|
| H01L 21/76 | (2006.01) |
| H01L 51/00 | (2006.01) |
| H01L 51/50 | (2006.01) |
| H01L 51/56 | (2006.01) |

(52) U.S. Cl.
CPC ........ *H01L 51/0005* (2013.01); *H01L 51/5012* (2013.01); *H01L 51/56* (2013.01)

(58) Field of Classification Search
CPC .................................................... B05B 15/045
USPC ................................................. 438/34; 445/3
See application file for complete search history.

(56) References Cited

U.S. PATENT DOCUMENTS

| | | | | |
|---|---|---|---|---|
| 8,282,436 | B2* | 10/2012 | Kidu et al. | 445/24 |
| 8,389,323 | B2* | 3/2013 | Choi et al. | 438/82 |
| 2007/0148333 | A1* | 6/2007 | Morimoto | 427/66 |
| 2007/0160772 | A1* | 7/2007 | Morimoto et al. | 427/466 |
| 2007/0278933 | A1* | 12/2007 | Chao et al. | 313/500 |
| 2014/0342482 | A1* | 11/2014 | Morimoto | 438/34 |

FOREIGN PATENT DOCUMENTS

| | | | | |
|---|---|---|---|---|
| JP | 2009-163931 A | | 7/2009 | |
| JP | 2009163931 | * | 7/2009 | ............. H01L 51/50 |
| JP | 2011-048915 | | 3/2011 | |
| JP | 2012-033308 | | 2/2012 | |

* cited by examiner

*Primary Examiner* — Kyoung Lee
*Assistant Examiner* — Chi-Hua Yang
(74) *Attorney, Agent, or Firm* — Lee & Morse, P.C.

(57) ABSTRACT

A method of fabricating an organic electroluminescence display device includes providing a substrate including a plurality of pixel regions, first electrodes, and a partition wall, the pixel regions including two pixel columns, providing a mask including openings and first inclined surfaces, the openings being at positions corresponding to the two pixel columns, each of the first inclined surfaces being inclined toward one of the openings and including a portion extending to a region between the two pixel columns, positioning the mask such that each of the openings faces a portion of one of the pixel regions, dropping a solution containing an organic electroluminescence material onto the first inclined surfaces such that the solution is supplied onto the first electrodes through the openings to coat the first electrodes, evaporating solvent from the solution to form an organic electroluminescence layer, and forming a second electrode on the organic electroluminescence layer.

8 Claims, 7 Drawing Sheets

METHOD OF AND APPARATUS FOR FABRICATING ORGANIC ELECTROLUMINESCENCE DISPLAY DEVICE

CROSS-REFERENCE TO RELATED APPLICATION

Japanese Patent Application No. 2013-102363, filed on May 14, 2013, in the Japanese Intellectual Property Office, and entitled: "Method of and Apparatus for Fabricating Organic Electroluminescence Display Device," is incorporated by reference herein in its entirety.

BACKGROUND

1. Field

Example embodiments relate to a method of and an apparatus for fabricating an organic electroluminescence (EL) display device.

2. Description of the Related Art

Recently, an organic EL display device using an organic EL device has been developed. The organic EL device may include a light emitting layer provided in every pixel. An amount of electric current supplied to the light emitting layer may be selectively controlled to adjust an amount of light emitted therefrom. Accordingly, the organic EL display device may have good energy efficiency.

To display various colors (e.g., red (R), green (G), blue (B)) in a display device including the organic EL device, pixels may be configured to have a difference in structure of the organic EL layer.

The organic EL layer may be formed by, for example, an inkjet process, a nozzle printing, or coating process. The use of such a process may provide for selective formation of an organic material suitable for a desired color and t emission of light with the desired color.

In a comparative nozzle printing process, as illustrated in FIG. 1A, an organic EL layer may be formed by providing an ink-like organic solution 52, which is formed by dissolving an organic EL material with a solvent, to a substrate 50 provided with a partition wall 53. The partition wall 53 may be provided to define positions and arrangement of the organic EL layer and the pixels. Electrodes electrically connected to the organic EL layer may be formed on regions of the substrate 50 sectioned by the partition wall 53.

The organic solution 52 may be continuously ejected from a nozzle 51 moving with a speed of about 1 m/s to about 5 m/s along the direction C1 shown in FIGS. 1A and 1B in a dashing-off-with-one-stroke-of-a-brush manner to coat the substrate 50 with the organic solution 52. In the comparative nozzle printing process, the formation of the organic EL layer may be performed using a shutter plate 54, which is disposed between the nozzle 51 and the substrate 50 to have a slit 54' that is wide to the extent allowing for the ejection of the organic solution 52, as illustrated in FIG. 2A. After the coating process, the solvent in the organic solution 52 may be evaporated to form the organic EL layer on the regions sectioned by the partition wall 53.

SUMMARY

Embodiments are directed to a method of fabricating an organic electroluminescence display device including providing a substrate that includes a plurality of pixel regions, first electrodes on the plurality of pixel regions, respectively, and a partition wall that exposes the first electrodes and defines the pixel regions, the pixel regions including two pixel columns, providing a mask that includes openings and first inclined surfaces, the openings being respectively located at positions corresponding to the two pixel columns, each of the first inclined surfaces being inclined toward a corresponding one of the openings and including a portion that extends to a region between the two pixel columns, positioning the mask such that each of the openings faces a portion of a corresponding one of the pixel regions, dropping a solution containing an organic electroluminescence material onto the mask such that the solution is dropped onto each of the first inclined surfaces and is supplied onto the first electrodes through the openings to coat the first electrodes with the solution, evaporating solvent from the solution to form an organic electroluminescence layer, and forming a second electrode on the organic electroluminescence layer During the dropping of the solution, the solution may be ejected from a nozzle that moves along a straight line between the two pixel columns.

The mask may be configured to further include second inclined surfaces, each of the second inclined surfaces being inclined toward a corresponding one of the first inclined surfaces.

The mask may include a surface that is treated by a liquid repellent process.

The method may further include performing a lyophilization process on the first electrode, the lyophilization process including an UV ozone treatment or an oxygen plasma treatment.

The method may further include performing a lyophilization process or a liquid repellent process on the partition wall. The lyophilization process may include an UV ozone treatment or an oxygen plasma treatment. The liquid repellent process may include a plasma treatment using fluorine-containing gas.

Embodiments are also directed to an apparatus for fabricating an organic electroluminescence display device, including a mask with openings and first inclined surfaces, and a nozzle that ejects a solution containing an organic electroluminescence material onto the mask, during movement of the nozzle toward a specific direction. The organic electroluminescence display device includes an organic electroluminescence structure including a first electrode, an organic electroluminescence layer, and a second electrode that are sequentially stacked on each of pixel regions, the pixel regions including two pixel columns. The openings of the mask are respectively located at positions corresponding to the two pixel columns. Each of the first inclined surfaces is inclined toward a corresponding one of the openings and includes a portion extending to a region between the two pixel columns.

The mask may further include second inclined surfaces, each of which is inclined toward a corresponding one of the first inclined surfaces.

BRIEF DESCRIPTION OF THE DRAWINGS

Features will become apparent to those of skill in the art by describing in detail exemplary embodiments with reference to the attached drawings in which:

FIGS. 1A and 1B illustrate sectional and plan views, respectively, depicting the comparative method of fabricating an organic EL display device.

FIGS. 2A and 2B illustrate sectional and plan views, respectively, depicting the comparative method of fabricating an organic EL display device.

FIG. 3A illustrates a plan view depicting a pixel arrangement on a substrate and FIG. 3B illustrates a plan view depicting a substrate, on which a mask is provided.

FIG. 4A illustrates a plan view of the mask and FIG. 4B illustrates a sectional view taken along a line A-A' of the plan view FIG. 4A.

FIG. 6A illustrates a plan view depicting a pixel arrangement on a substrate and FIG. 6B illustrates a plan view depicting a substrate on which a mask is provided.

FIG. 7A illustrates a plan view of the mask and FIG. 7B illustrates a sectional view taken along a line B-B' of the plan view FIG. 7A.

DETAILED DESCRIPTION

Figure 1A:
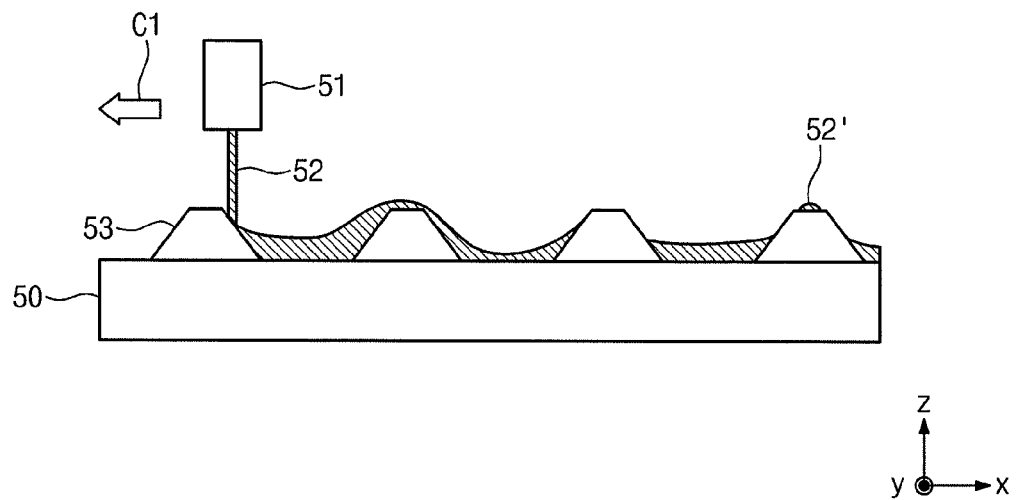
FIGS. 1A and 1B illustrate diagrams depicting a comparative method of fabricating an organic EL display device, where

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a method of fabricating an organic EL display device, according to example embodiments, will be described in more detail with reference to FIGS. 3 through 7.

A method of fabricating an organic EL display device, according to an embodiment, will be described with reference to FIGS. 3 through 5.

Figure 3A:
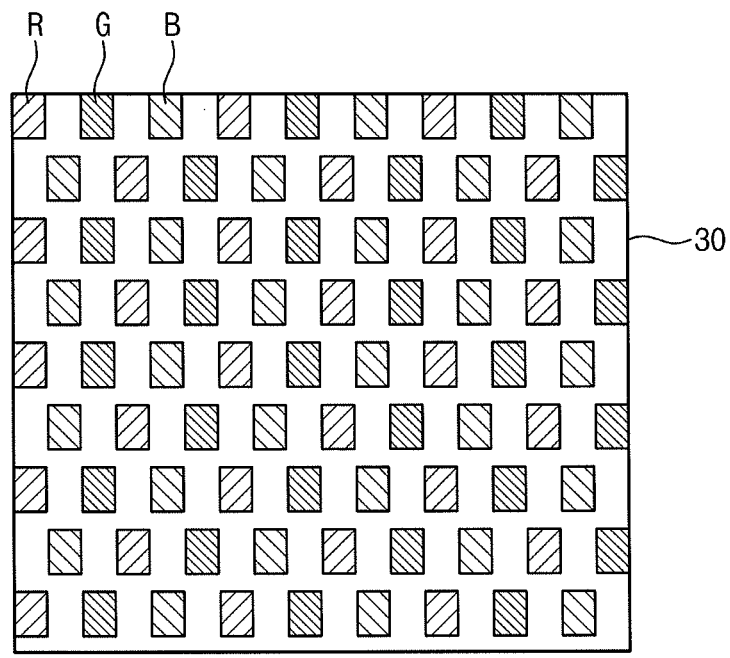
FIGS. 3A and 3B illustrate diagrams depicting a method of fabricating an organic EL display device, according to an embodiment, where
Figure 3B:
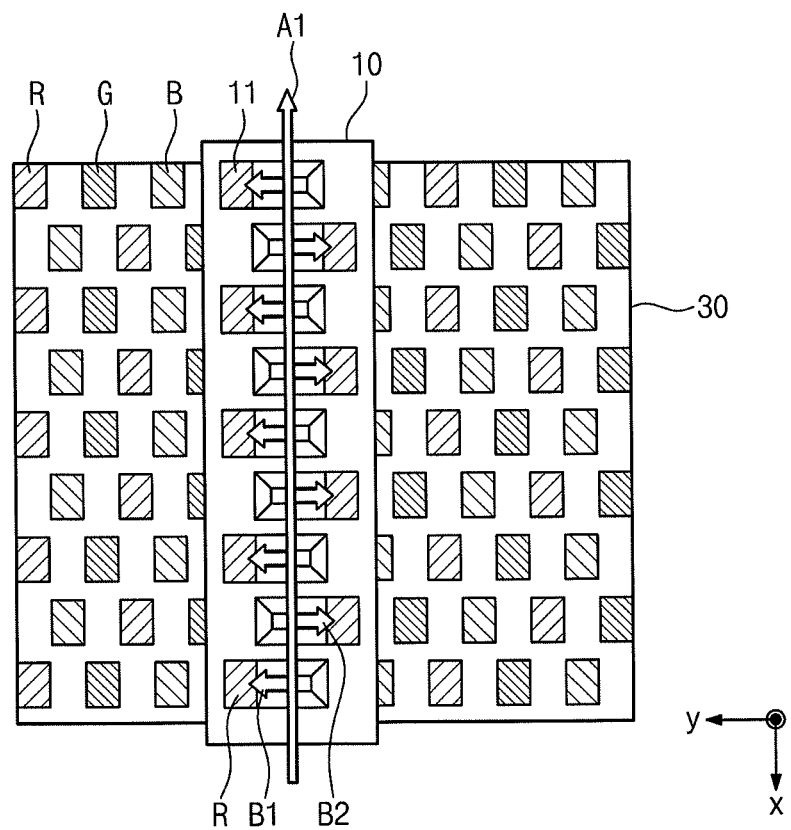
Figure 4A:
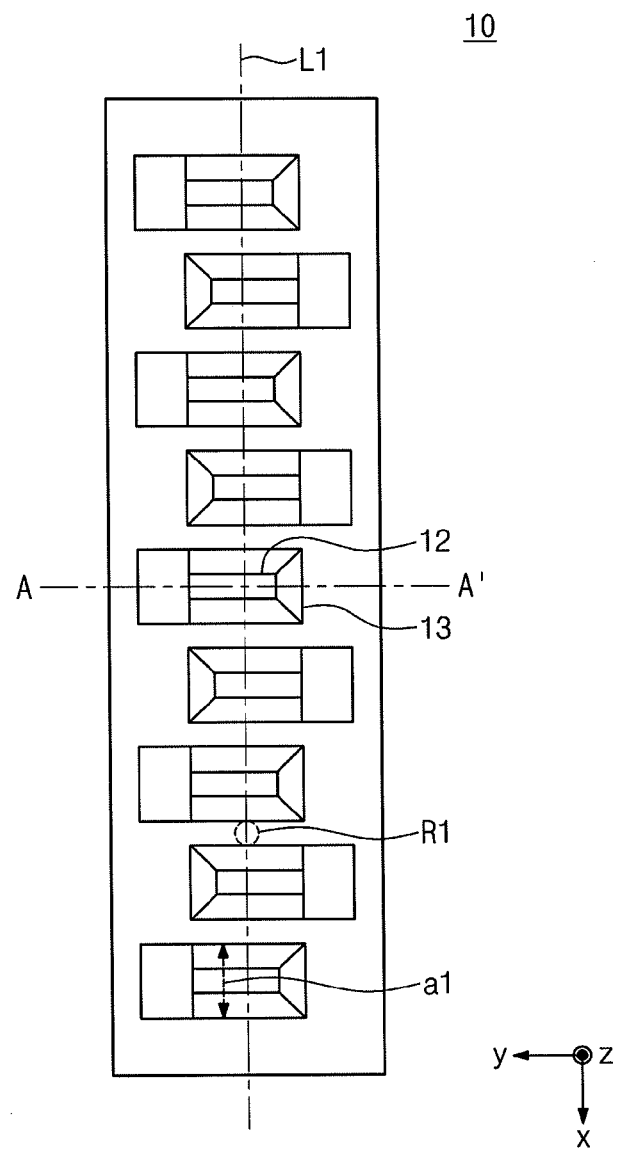
FIGS. 4A and 4B illustrate diagrams depicting a mask that may be used in the method of fabricating an organic EL display device according to the embodiment, where
Figure 4B:
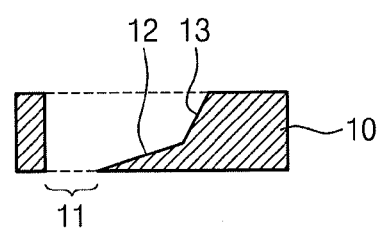

FIGS. 3A and 3B illustrate diagrams depicting a method of fabricating an organic EL display device, according to an embodiment. FIG. 3A illustrates a plan view depicting a pixel arrangement on a substrate 30, and FIG. 3B illustrates a plan view depicting the substrate 30, on which a mask 10 is provided. FIG. 4 illustrates a diagram depicting the mask 10, which may be used in the method of fabricating an organic EL display device according to the embodiment, where FIG. 4A illustrates a plan view of the mask 10 and FIG. 4B illustrates a sectional view taken along a line A-A' of the plan view FIG. 4A. FIG. 5 illustrates a sectional view depicting the method of fabricating an organic EL display device, according to the embodiment.

First, a substrate 30 may be prepared or provided. In certain implementations, the substrate 30 may include low temperature polysilicon thin-film transistors (TFTs) or interconnection lines provided on a glass substrate, and circuits for selectively supplying electric current to the organic EL layer constituting pixels.

In certain implementations, the substrate 30 may be formed by the following exemplary method. First, active regions for TFTs may be formed on the glass substrate. Each of active regions may have an island-like shape. The active regions may be made of polysilicon. The formation of the polysilicon active regions may include forming an amorphous silicon layer using, for example, a plasma-enhanced chemical vapor deposition (PE-CVD) process, performing a rapid thermal annealing (RTA) process or an excimer laser annealing (ELA) process to transform the amorphous silicon layer to a polysilicon layer, and then patterning the polysilicon layer.

A gate insulating layer may be formed on a surface of the polysilicon layer. The gate insulating layer may be a silicon oxide layer or a silicon nitride layer, which may be formed by a CVD process.

A gate electrode may be formed on the gate insulating layer to cover a portion of a TFT region. The formation of the gate electrode may include forming a metal thin-film, which may be formed of, for example, Ag, Al, Ti, Mo, Cu, W, or alloys thereof, and then, patterning the metal thin-film.

An insulating layer may be formed on the gate insulating layer and the gate electrode. The insulating layer may be a silicon oxide layer or a silicon nitride layer, which may be formed by a CVD process. Contact holes may be formed to expose the polysilicon layer through the insulating layer. Interconnection lines may be connected to source/drain regions of the polysilicon layer through the contact holes. The interconnection lines may be formed by patterning a metal thin film, which may be formed of Ag, Al, Ti, Mo, Cu, W, or alloys thereof.

An additional insulating layer may be further formed to cover the insulating layer and the interconnection lines. The additional insulating layer may be a silicon oxide layer or a silicon nitride layer, which may be formed by a CVD process.

An anode may be electrically connected to the TFT. A reflection electrode (e.g., of silver (Ag)) may be formed below the anode and on the insulating layer. The anode may be electrically connected to the TFT formed on the substrate 30 through a contact hole penetrating the insulating layer on the TFT, the reflection electrode, etc. The anode may be formed of a metal layer (e.g., indium tin oxide (ITO), indium zinc oxide (IZO), ZnO, or $MoO_3$) having a relatively high work function. In certain implementations, the substrate 30 illustrated in FIG. 3 may be configured to have the aforedescribed structure.

Thereafter, a partition wall 33 (e.g., in FIG. 5) may be formed to define each pixel region and expose each anode. The partition wall 33 may be an organic insulating layer that is made of at least one selected from the group of polyimide, polyamide, acrylic resin, benzocyclobutene, and phenol resin, and may be formed by, for example, a slit coating method. In other implementations, the partition wall 33 may be an inorganic insulating layer made of at least one selected from the group of silicon oxide, silicon nitride, and aluminum oxide, instead of the organic insulating layer. After the formation of the insulating layer, a resist layer may be coated onto a surface of the insulating layer and may be selectively exposed to form resist patterns. Thereafter, the insulating layer may be etched using the resist patterns as an etch mask to form the partition wall 33 defining the pixel regions.

An organic EL layer may be formed on the anode sectioned by the partition wall 33. In example embodiments, the organic EL layer may include a hole injection layer (HIL), a hole transport layer (HTL), a light emitting layer EML, an electron transport layer ETL, and an electron injection layer EIL, which are sequentially formed on the anode.

Figure 5:
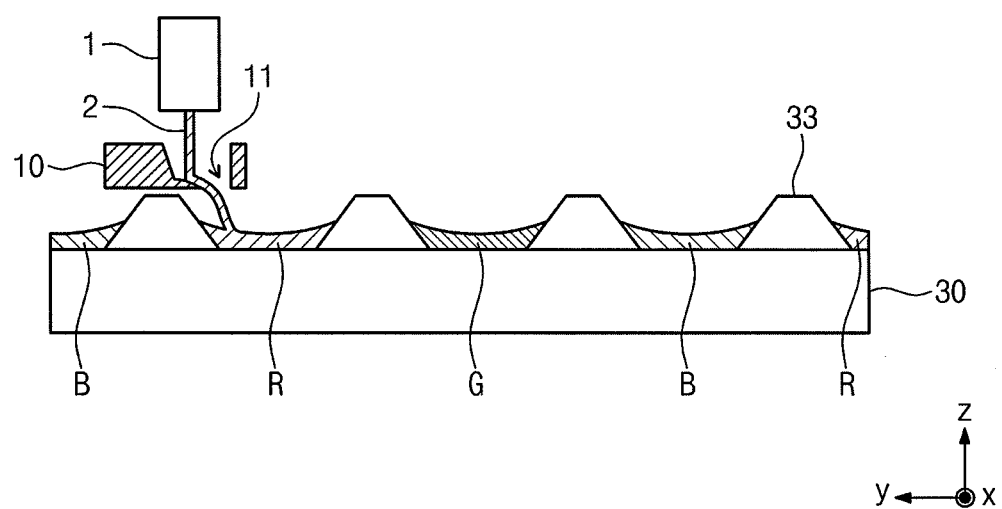
FIG. 5 illustrates a sectional view depicting the method of fabricating an organic EL display device, according to the embodiment.

As illustrated in FIG. 5, the organic EL layer may be formed by a nozzle printing process, in which an ink-like organic solution 2 formed by dissolving an organic EL material with a solvent is provided on the anode sectioned or defined by the partition wall 33. As illustrated in FIG. 3A, a plurality of pixels of red (R), green (G), and blue (B) may be disposed on the substrate 30 to form a delta arrangement. As illustrated in FIG. 3A, in the delta arrangement, the pixels of red (R), green (G), and blue (B) may be arranged in triangular manner. For example, the pixels of red (R), green (G), and blue (B) may be arranged along vertical, horizontal, and diagonal directions. Each pixel of a specific pixel column may be offset from a corresponding one of pixels of other adjacent pixel column in a column direction, and moreover, each of pixels constituting a specific pixel column may be offset from a corresponding one of pixels constituting other pixel columns and displaying the same color in the column direction.

When pixels are provided to form the delta arrangement, as illustrated in FIG. 3B, a mask 10 may be provided to have a plurality of openings 11, each of which is positioned to face a pixel of two pixel columns that are made of the same organic material and are configured to display the same color. As illustrated in FIGS. 4A and 4B, the mask 10 may have a plurality of openings 11. When the mask 10 is provided on the substrate 30, the openings 11 may be located at positions corresponding to the pixel regions. In addition, in the coating process of the organic solution 2, as illustrated in FIG. 5, the mask 10 may be disposed to veil top portions of a plurality of partition walls 33, and the plurality of openings 11 may be positioned on regions of the plurality of organic EL layers.

As illustrated in FIGS. 4A and 4B, the mask 10 may be provided to have openings 11 and first inclined surfaces 12, each inclined surface 12 being inclined toward a corresponding one of the openings 11. The organic solution 2 may be dropped on the mask 10 along a line L1 (hereinafter, referred to as a "coating line L1") of FIG. 4A. The coating line L1 may be positioned between two pixel columns, to which the coating process will be performed, to cross all of the first inclined surfaces 12 of the mask 10. The first inclined surfaces 12 may be disposed in such a way that the coating line L1 crosses adjacent ones of the first inclined surface 12. The nozzle 1 may have a head portion for ejecting the organic solution 2. The head portion of the nozzle 1 may be moved from one end (for example, a bottom end) of the mask 10 to another end (for example, a top end) of the mask 10 along the coating line L1 or along a direction A1 parallel to the pixel column illustrated in FIG. 3B. Herein, the terms "bottom end" and "top end" may be understood as referring to the bottom and top of the drawing figure FIG. 3B. The organic solution 2 may be dropped onto the mask 10 in such a way that a track of the organic solution 2 is shaped like a line (i.e., the organic solution 2 may be dropped along the coating line L1).

The first inclined surface 12 is inclined toward the opening 11. The organic solution 2 dropped on the first inclined surface 12 may flow toward the opening 11 adjacent thereto or toward a direction B1 or B2 as illustrated in FIG. 3B. Accordingly, it may be possible to prevent the organic solution 2 passing through each of the openings 11 from being dropped into undesired regions other than a target region to be coated or onto the partition wall 33. Further, by performing the process of ejecting the organic solution 2 through the nozzle 1 once along the direction of the pixel column, it may be possible to coat simultaneously the pixel regions constituting two pixel columns.

The nozzle 1 for the coating process may be configured to have a diameter of about 5 μm to about 20 μm. In certain implementations, a moving speed of the nozzle 1 may range from 1 m/s to 5 m/s. When the organic material in the organic solution 2 is a conductive polymer such as polyethylene dioxythiophene/polystyrene sulfonate (PEDOT/PSS), the solvent may be a liquid-type solvent such as water, ethanol, or ethylene glycol. When a conjugated polymer (e.g., polyphenylenevinylene polymer or polyfluorene polymer) is used, the solvent may be water or an aromatic organic solvent (e.g., tetralin, tetramethyl benzene, mesitylene, xylene, or toluene). By using the nozzle 1 and the organic solution 2 configured as described above, it may be possible to prevent the organic solution 2 from being solidified during the coating process and to prevent the organic solution 2 from remaining in the nozzle 1. The organic solution 2 dropped on the mask 10 may smoothly flow along the first inclined surface 12 of the mask 10 without accumulating on the opening 11.

As illustrated in FIG. 4A, the mask 10 may be configured to include second inclined surfaces 13, each of which is inclined toward the first inclined surface 12 adjacent thereto. As illustrated in FIG. 4A, the second inclined surface 13 may be connected to three sides of the first inclined surface 12, except for a side of the first inclined surface 12 adjacent to the opening 11. Due to the presence of the second inclined surfaces 13, the organic solution 2 may flow from the second inclined surface 13 into the opening 11 along the first inclined surface 12, when the organic solution 2 is dropped on the second inclined surface 13 and even when the organic solution 2 rebounds from the first inclined surface 12 toward the second inclined surface 13.

In certain implementations, the mask 10 may be provided such that the first inclined surfaces 12 have the same length and the second inclined surfaces 13 have the same length, when measured in the x-direction (e.g., illustrated in FIG. 4A). Further, as illustrated by reference numeral 'a1' of FIG. 4A, the first and second inclined surfaces 12 and 13 connected to each opening 11 may have the same length a1 in the x-direction. Accordingly, the process of coating the organic solution 2 may be performed using the first and second inclined surfaces 12 and 13, whose lengths in the x-direction are the same. It may be possible to provide improved uniformity in amount of the organic solution 2 flowing into the openings 11 along the first and second inclined surfaces 12 and 13.

When the mask 10 is disposed on the substrate 30, the openings 11 may be positioned to face the pixel regions, respectively. In certain implementations, each of the openings 11 may be formed to have the same area as that of each pixel region. However, as illustrated in FIG. 5, in the case where the mask 10 is provided to veil the top surfaces of the partition walls 33, an area of each opening 11 may be smaller than that of each pixel region.

The mask 10 may be formed of a material resistive to the ink to be used. Considering a process precision and a thermal expansion coefficient, the mask 10 may be formed of a metal such as stainless steel (SUS). In certain implementations, a liquid repellent process may be performed to a surface of the mask 10. For example, the liquid repellent process may be a plasma treatment using fluorine-containing gas.

As the result of the liquid repellent process, the organic solution 2 dropped on the surface of the mask 10 may flow toward the opening 11 without accumulation on the surface of the mask 10. For example, referring to FIG. 4A, even if the organic solution 2 is dropped on a region R1 of the mask around the opening 11 and the first and second inclined surfaces 12 and 13, the organic solution 2 can flow into the opening 11. As the result of the liquid repellent process applied to the surface of the mask 10, the organic solution 2 may flow toward any of the first and second inclined surfaces 12 and 13 adjacent thereto, without accumulation on the region R1.

In the case where the region R1 illustrated in FIG. 4A is formed to have an area smaller than that of one of the first and second inclined surface 12 and 13, the organic solution 2 may easily flow toward the opening 11, without accumulation on the region R1. Accordingly, each pixel region may be uniformly coated with the organic solution 2, without accumulation of the organic solution 2 on the mask 10.

In example embodiments, before the process of coating the organic solution 2 on each pixel region, a lyophilization process, such as a UV ozone treatment or an oxygen plasma treatment, may be performed on the anode. In addition, a lyophilization process (for example, a UV ozone treatment or an oxygen plasma treatment) or a liquid repellent process (for example, a plasma treatment using fluorine-containing gas) may be performed on the partition walls 33. These processes or treatments may make it easy to form the organic EL layer on the anode, while preventing the organic solution 2 from being attached on the partition walls 33. In certain embodiments, the partition walls 33 may be coated by or formed of a liquid repellent material.

FIGS. 3 and 5 illustrate a process of coating the organic solution 2 on the pixel columns of red (R) pixels The mask 10 may be used in the same manner to coat other pixel regions for the same color (e.g., for realizing the green (G) pixels and blue (B) pixels) with the organic solution 2. During the process of coating the organic solution 2, temperature of the surface of the substrate 30 may be adjusted (for example, increased or decreased) by a temperature control apparatus.

According to this embodiment, in the process of fabricating an organic EL display device, the mask 10 disposed between the nozzle 1 and the substrate 30 may be used in connection with the fabrication system described with respect to the comparative example. Accordingly, the use of the mask 10 may make it possible to coat simply each pixel region with the organic solution 2 through the openings 11 of the mask 10. Compared with the comparative fabricating method illustrated in FIGS. 1 and 2, the top surface of the partition wall 33 may be veiled by the mask 10. Accordingly, it may be possible to prevent the organic solution 2 from being dropped on the partition wall 33. It may be possible to prevent the organic solution 2 from remaining on the partition wall 33 and it may be possible to provide a uniform amount of the organic solution 2 to each pixel region.

According to this embodiments, in the process of fabricating an organic EL display device, even in the case of the delta arrangement, the pixel regions constituting two pixel columns may be simultaneously coated with the organic solution 2 by performing the process of ejecting the organic solution 2 through the nozzle 1 once along the direction of the pixel column and by using the mask 10. It may be possible to reduce the number of process stages constituting the fabrication process and to improve a coating uniformity of the organic EL material through a simple fabrication process.

After performing the process of coating the organic solution 2 on each pixel region, the substrate 30 may be thermally treated to transpire or evaporate the solvent. If the organic solution 2 can be quickly dried, a thermal treatment may be omitted. The mask 10 may be detached from the substrate 30 after the solidification of the organic EL material.

A hole injection layer (HIL), a hole transport layer (HTL), a light emitting layer (EML), an electron transport layer (ETL), and an electron injection layer (EIL) may be sequentially formed, for example, using the coating method, to form the organic EL layer on the anode of each pixel region. Thereafter, the cathode, which may be made of Al, Ni, Mg, or alloys thereof, may be formed on the electron injection layer EIL to form the organic EL layer structure.

According to the afore-described structure of the organic EL layer, the anode and the cathode may be provided on the substrate 30 and the organic EL layer, respectively. In other implementations, the cathode and the anode may be provided on the substrate 30 and the organic EL layer, respectively.

A method of fabricating an organic EL display device, according to another embodiment, will be described with reference to FIGS. 6 and 7.

Figure 6A:
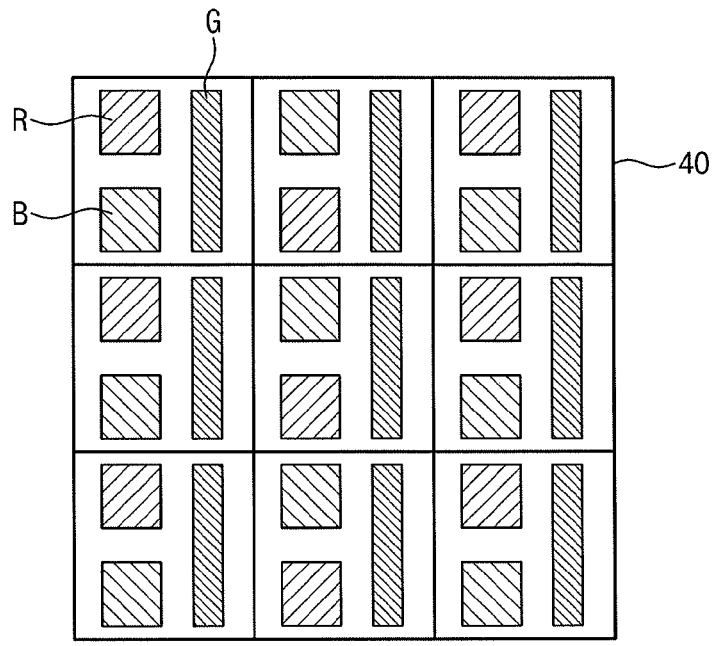
FIGS. 6A and 6B illustrate diagrams depicting a method of fabricating an organic EL display device, according to another embodiment, where
Figure 6B:
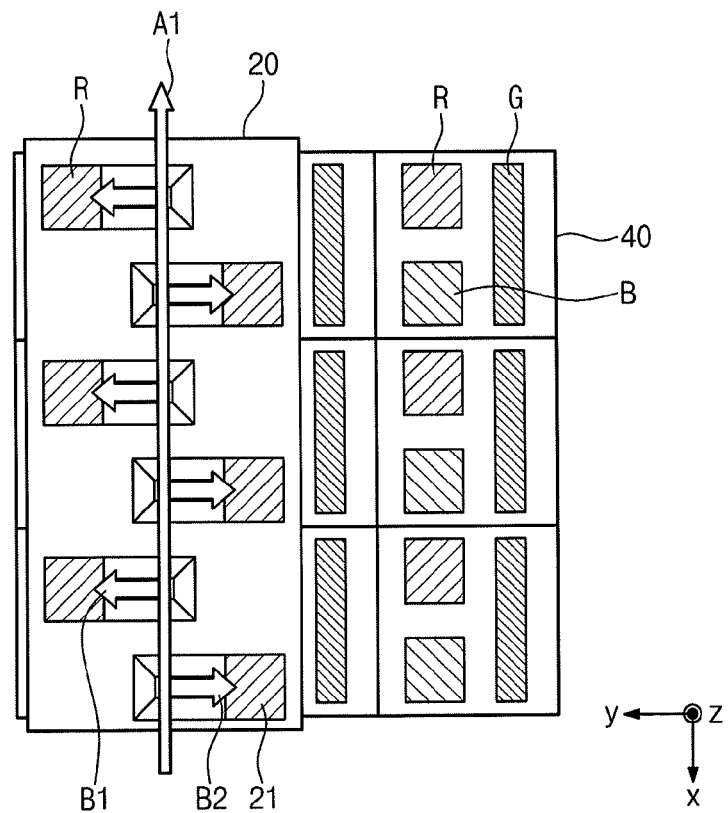

FIGS. 6A and 6B illustrate diagrams depicting a method of fabricating an organic EL display device, according to another embodiment. FIG. 6A illustrates a plan view depicting a pixel arrangement on a substrate 40, and FIG. 6B illustrates a plan view depicting the substrate 40, on which a mask 20 is provided.

Figure 7A:
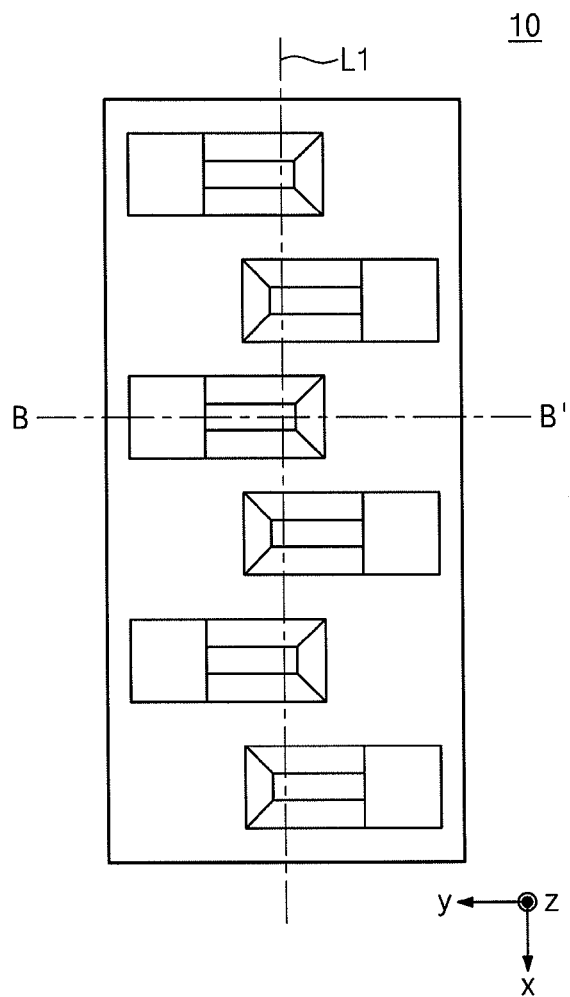
FIGS. 7A and 7B illustrate diagrams depicting a mask that may be used in the method of fabricating an organic EL display device according to this embodiment, where
Figure 7B:
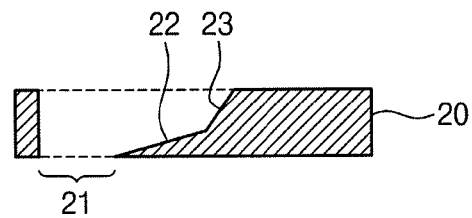

FIGS. 7A and 7B illustrate diagrams depicting the mask 20, which may be used in the method of fabricating an organic EL display device according to this embodiment FIG. 7A illustrates a plan view of the mask 20, and FIG. 7B illustrates a sectional view taken along a line B-B' of the plan view FIG. 7B.

Except for structural differences associated with the pixel arrangement and the mask, a method of fabricating an organic EL display device according to this embodiment may be similar to that of the previous embodiments. For concise description, overlapping description of elements previously described will not be repeated.

According to this embodiment, a mask 20 may be used to fabricate an organic EL display device having a PenTile arrangement, as illustrated in FIG. 6A. In the PenTile arrangement, each pixel may be configured to include two sets, one made up of green and red (GR) sub-pixels and the other made up of green and blue (GB) sub-pixels, as illustrated in FIG. 6A. Accordingly, when viewed in the column direction or the x-direction, each of the red pixels R may be alternatingly disposed between a corresponding one of adjacent pairs of the blue pixels B.

Similar to the mask 10, the mask 20 for the PenTile arrangement may include openings 21 and first inclined surfaces 22. Each of the first inclined surfaces 22 of the mask 20 may be inclined toward the opening 21 adjacent thereto, as illustrated in FIGS. 7A and 7B. As illustrated in FIG. 6B, the openings 21 may be respectively formed at positions corresponding to pixel regions constituting two adjacent pixel columns. As illustrated in FIG. 7A, the first inclined surface 22 may be provided in such a way that a portion thereof is positioned on the coating line L1 crossing two adjacent pixel columns. Similar to the second inclined surface 13, the mask 20 may further include second inclined surfaces 23, each of which is inclined toward a corresponding one of the first inclined surface 22.

Similar to the mask 10 illustrated in FIG. 5, the mask 20 may be disposed to veil the top portions of the partition walls 33 defining the pixel regions. The nozzle 1 may have a head portion for ejecting the organic solution 2. The head portion of the nozzle 1 may be moved from first end (for example, a bottom end) of the mask 20 to another end (for example, a top end) of the mask 20 along the coating line L1 or along a direction A1 parallel to the pixel column of FIG. 6B. The terms "bottom end" and "top end" may be understood as referring to the bottom and top of the drawing figure, FIG. 6B. The organic solution 2 may be dropped on the mask 20 in such a way that the track of the organic solution is shaped like a line (i.e., dropped along the coating line L1). The organic solution 2 dropped on the first inclined surface 22 may flow toward a direction B1 or B2 as illustrated in FIG. 6B. Accordingly, it may be possible to achieve increased uniformity in amount of the organic solution 2 to be distributed into the pixel regions through the openings 21.

According to this embodiment, in the process of fabricating an organic EL display device, the mask 20 disposed between the nozzle 1 and a substrate 40 may be used along with the comparative fabrication system, similar to the previously described method of the embodiment illustrated in FIGS. 3A to 5. The use of the mask 20 may make it possible to distribute uniformly the organic solution 2 into the pixel regions through the openings 21 thereof. Compared with the comparative fabricating method illustrated in FIGS. 1 and 2, the top surfaces of the partition walls 33 may be veiled by the mask 20, and thus, it may be possible to prevent the organic solution 2 from being dropped onto the partition walls 33. Accordingly, it may be possible to prevent the organic solution 2 from remaining on the partition wall 33 and to provide a uniform amount of the organic solution 2 to each pixel region.

According to this embodiments, in the process of fabricating an organic EL display device, even in the case of the PenTile arrangement, the pixel regions constituting two pixel columns can be simultaneously coated with the organic solution 2 by performing the process of ejecting the organic solution 2 through the nozzle 1 once along the direction of the pixel column and by using one mask 20. According to example embodiments, it may be possible to reduce the number of process stages constituting the fabrication process and to improve a coating uniformity of the organic EL material through a simple fabrication process.

Further, in the embodiments previously described as illustrated in FIGS. 3A to 5 and in FIGS. 6A to 7B, one mask 10 or 20 may be used to coat two adjacent pixel columns displaying the same color. In other implementations, one mask 10 or 20 may be used to coat three or more pixel columns. In the embodiments previously described, the delta and PenTile arrangements were described as examples of the pixel arrangements. It is to be understood that the method of these embodiments may be used with respect to other pixel arrangements. The mask 10 or 20 may be configured in such a way that the first inclined surface 12 or 22 connected to the opening 11 or 21 is disposed between two pixel columns for displaying the same color, and by using such a mask 10 or 20, such that the described method may be applied for an organic EL display device with other pixel arrangements.

As described above, according to example embodiments, even for a pixel arrangement in which pixels for displaying the same color are not continuously arranged in a line, the organic EL material may be formed to have an improved coating uniformity, and a process of forming the same may be simplified. As a result, it may be possible to prevent the thickness of the organic EL layer from varying from pixel to pixel.

Figure 1B:
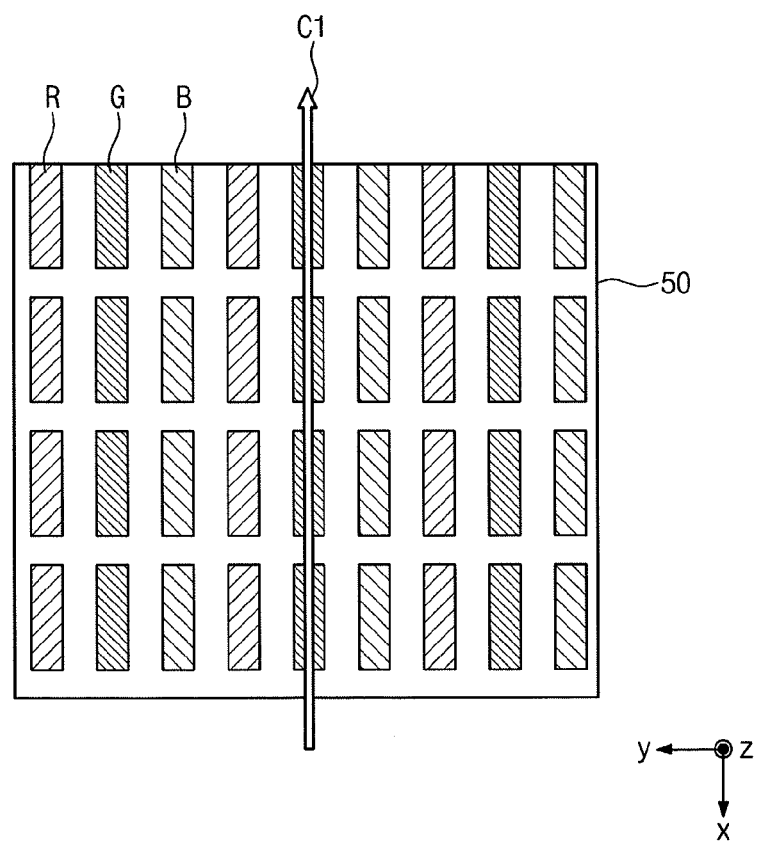

By way of summation and review, according to the comparative nozzle printing process illustrated in FIG. 1A, after the evaporation of the solvent, an organic material 52' that originated from the organic solution 52 may remain on the top of the partition wall 53. In addition, the organic solution 52 dropped onto the partition wall 53 may flow from the top of the partition wall 53 into a region adjacent thereto, but owing to solidification of the organic solution 52, it may be difficult to uniformly control an amount of the organic solution 52 flowing into the each region.

Figure 2A:
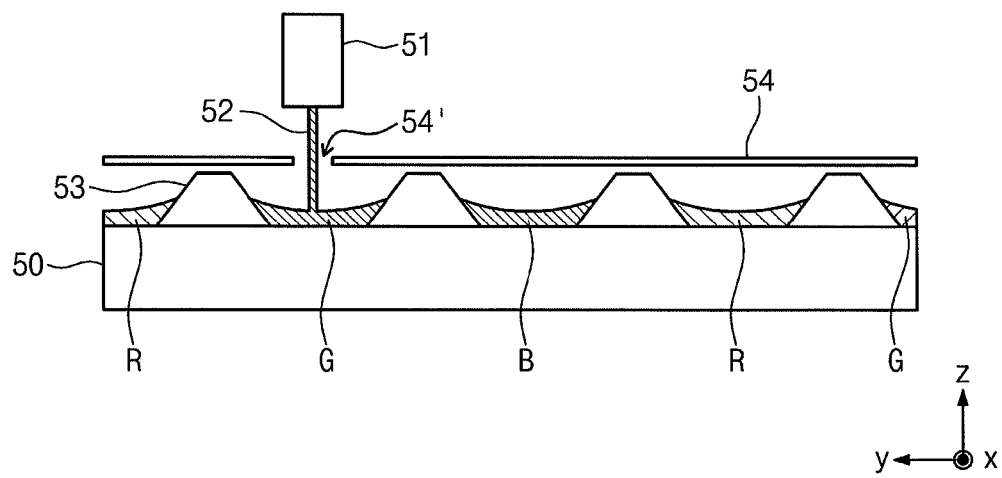
FIGS. 2A and 2B illustrate diagrams depicting a comparative method of fabricating an organic EL display device, where

As illustrated in FIG. 2A, the shutter plate 54 disposed between the nozzle 51 and the substrate 50 and having a wide slit 54' may cover regions other than a target region to be coated. Accordingly, an amount of the organic material 52' unintentionally formed on the coating regions and the partition wall 53, after the evaporation of solvent may be reduced.

Figure 2B:
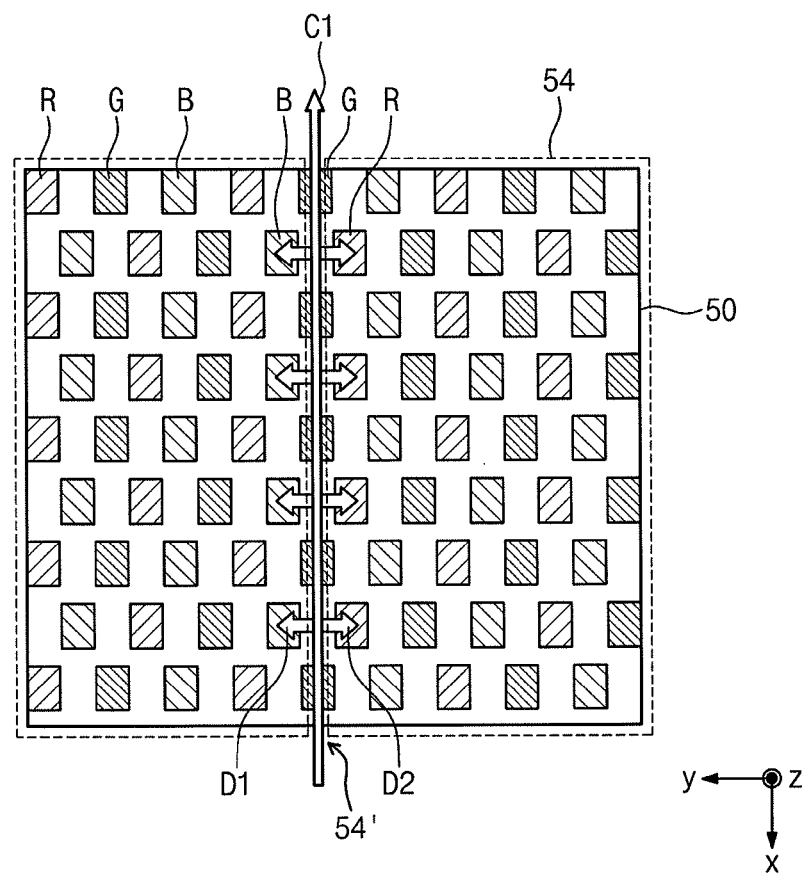

However, according to the afore-described comparative nozzle printing process of forming the organic EL layer, in the case of a delta-type pixel arrangement as illustrated in FIG. 2B, the organic solution 52 on the partition wall 53 may flow toward directions of D1 and D2, and thereby may coat regions other than a target region to be coated. Further, when pixels are in a PenTile arrangement, pixels that contain the same organic material and display the same color may not be arranged in a line. Accordingly, the afore-described comparative nozzle printing process may not be applicable to the PenTile arrangement.

Embodiments may provide a method of and an apparatus for fabricating an organic EL display device, which are configured to be able to improve coating uniformity of an organic EL material. The method may include forming first electrodes on a substrate with pixel regions, forming a partition wall exposing the first electrode and defining the pixel regions, dropping a solution on a mask with openings and first inclined surfaces to coat the first electrodes with the solution, evaporating solvent from the solution to form an organic electroluminescence layer, and forming a second electrode on the organic electroluminescence layer. The openings may be respectively located to correspond to the pixel regions constituting two pixel columns, and the first inclined surfaces may be inclined toward the openings and may extend to a region between the two pixel columns. The mask may be disposed on the partition wall in such a way that the openings face pixel regions, respectively. The solution contains an organic electroluminescence material, and the solution may be dropped on the first inclined surfaces and be supplied onto the first electrode through the opening.

By using the method and apparatus, it may be possible to improve coating uniformity of an organic EL material with ease, regardless of a type of the pixel arrangement.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof t as set forth in the following claims.

What is claimed is:

1. A method of fabricating an organic electroluminescence display device, the method comprising:
   providing a substrate that includes a plurality of pixel regions, first electrodes on the plurality of pixel regions, respectively, and a partition wall that exposes the first electrodes and defines the pixel regions, the pixel regions including two pixel columns;
   providing a mask that includes openings and first inclined surfaces, the openings being respectively located at positions corresponding to the two pixel columns, each of the first inclined surfaces being inclined toward a corresponding one of the openings and including a portion that extends to a region between the two pixel columns,
   positioning the mask such that each of the openings faces a portion of a corresponding one of the pixel regions;
   dropping a solution containing an organic electroluminescence material onto the mask such that the solution is dropped onto each of the first inclined surfaces and is supplied onto the first electrodes through the openings to coat the first electrodes with the solution;
   evaporating solvent from the solution to form an organic electroluminescence layer; and
   forming a second electrode on the organic electroluminescence layer.

2. The method as claimed in claim 1, wherein during the dropping of the solution, the solution is ejected from a nozzle that moves along a straight line between the two pixel columns.

3. The method as claimed in claim 1, wherein the mask is configured to further include second inclined surfaces, each of the second inclined surfaces being inclined toward a corresponding one of the first inclined surfaces.

4. The method as claimed in claim 1, wherein the mask includes a surface that is treated by a liquid repellent process.

5. The method as claimed in claim 1, further comprising performing a lyophilization process on the first electrode, the lyophilization process including an UV ozone treatment or an oxygen plasma treatment.

6. The method as claimed in claim 1, further comprising performing a lyophilization process or a liquid repellent process on the partition wall,
   the lyophilization process including an UV ozone treatment or an oxygen plasma treatment, and
   the liquid repellent process including a plasma treatment using fluorine-containing gas.

7. An apparatus for fabricating an organic electroluminescence display device, the apparatus comprising:
   a mask with openings and first inclined surfaces; and
   a nozzle that ejects a solution containing an organic electroluminescence material onto the mask, during movement of the nozzle toward a specific direction,
   wherein the organic electroluminescence display device includes an organic electroluminescence structure including a first electrode, an organic electroluminescence layer, and a second electrode that are sequentially stacked on each of pixel regions, the pixel regions including two pixel columns;
   the openings of the mask are respectively located at positions corresponding to the two pixel columns,
   each of the first inclined surfaces is inclined toward a corresponding one of the openings and includes a portion extending to a region between the two pixel columns.

8. The device as claimed in claim 7, wherein the mask further includes second inclined surfaces, each of which is inclined toward a corresponding one of the first inclined surfaces.

* * * * *